United States Patent
Ishibashi et al.

(10) Patent No.: US 7,880,197 B2
(45) Date of Patent: Feb. 1, 2011

(54) AVALANCHE PHOTODIODE HAVING DOPING REGION WITH MONOTONICALLY INCREASING CONCENTRATION DISTRIBUTION

(75) Inventors: Tadao Ishibashi, Tokyo (JP); Seigo Ando, Tokyo (JP); Yukihiro Hirota, Atsugi (JP); Yoshifumi Muramoto, Atsugi (JP)

(73) Assignees: NTT Electronics Corporation, Tokyo (JP); Nippon Telegraph and Telephone Corporation, Tokyo (JP)

( * ) Notice: Subject to any disclaimer, the term of this patent is extended or adjusted under 35 U.S.C. 154(b) by 517 days.

(21) Appl. No.: 11/993,801

(22) PCT Filed: Jun. 27, 2006

(86) PCT No.: PCT/JP2006/312800

§ 371 (c)(1),
(2), (4) Date: Dec. 21, 2007

(87) PCT Pub. No.: WO2007/000996

PCT Pub. Date: Jan. 4, 2007

(65) Prior Publication Data

US 2010/0163925 A1    Jul. 1, 2010

(30) Foreign Application Priority Data

Jun. 27, 2005    (JP) .............................. 2005-186551

(51) Int. Cl.
H01L 31/06    (2006.01)
(52) U.S. Cl. ................................ 257/186; 257/E31.063
(58) Field of Classification Search ................ 257/186, 257/438, E31.063
See application file for complete search history.

(56) References Cited

U.S. PATENT DOCUMENTS 5,075,750 A    12/1991    Kagawa (Continued)

FOREIGN PATENT DOCUMENTS

JP    08-181349    7/1996

(Continued)

OTHER PUBLICATIONS

S. Tanaka et al., *10Gbit/s Avalanche Photodiodes Applicable to Non-Hermetic Receiver Modules*, OFC2003, vol. 1, MF55, 2003, pp. 67-68.

(Continued)

*Primary Examiner*—Thomas L Dickey
(74) *Attorney, Agent, or Firm*—Workman Nydegger

(57) ABSTRACT

In an electron-injection type APD, it is necessary to prevent a dark current increase and to secure the life time of the device. It is demanded to improve reliability of the APD with a lower production cost. With the InP buffer layer having an n-type doping region on the inside of a region defined by an optical absorption layer, a predetermined doping profile is achieved by ion implantation. Thus, electric field concentration in the avalanche multiplication layer is relaxed. Furthermore, a low-concentration second optical absorption layer is provided between the optical absorption layer and the avalanche multiplication layer. Responsivity of the optical absorption layer is maximized, and depletion of the lateral surface of the optical absorption layer is prevented; thus, electric field concentration is prevented. Preventing edge breakdown, the device improves its reliability.

4 Claims, 5 Drawing Sheets

U.S. PATENT DOCUMENTS

| | | |
|---|---|---|
| 5,539,221 A | 7/1996 | Tsuji et al. |
| 5,654,578 A | 8/1997 | Watanabe |
| 6,104,047 A | 8/2000 | Watanabe |

FOREIGN PATENT DOCUMENTS

| | | |
|---|---|---|
| JP | 11-330536 | 11/1999 |
| JP | 2000-022197 | 1/2000 |
| JP | 2005-086109 | 3/2005 |
| JP | 2005-223022 | 8/2005 |

OTHER PUBLICATIONS

A. Shono et al., *10Gb/s High-Sensitivity Planar Type APD for Small Optical Receiver Module*, IEICE 2004, C-4-37, 2004, p. 365, with partial English translation.

Y. Hirota et al., *Reliable Non-Zn-Diffused InP/InGaAs Avalanche Photodiode with Buried n-InP Layer Operated by Electron Injection Mode*, Electronics Letters, vol. 40, No. 21, Oct. 2004, pp. 1378-1380.

– 1 –

AVALANCHE PHOTODIODE HAVING DOPING REGION WITH MONOTONICALLY INCREASING CONCENTRATION DISTRIBUTION

TECHNICAL FIELD

The present invention relates to an ultrafast avalanche photodiode operating at the long-wavelength used for optical communication, and, more particularly, the present invention relates a guard ring structure for securing a stable operation of an avalanche photodiode capable of ultrafast operation.

BACKGROUND ART

In response to the Internet and multimedia being in widespread use in recent years, a high-speed, high-capacity optical communications system is demanded. Under the circumstances with such a demand, a system with a transmission rate of 40 Gbit/s has been expected to be implemented on the basis of a faster channel transmission rate and multichannel WDM. In an optical communications system, one of the most important parts exerting an influence on the system performance is an avalanche photodiode which converts an optical signal to an electrical signal. The avalanche photodiode (hereafter referred to as APD) is a device utilized as a low-noise optical receiver, which generates carriers (electron and hole) by optical absorption, multiplies the carrier by an avalanche mechanism, and extract the output electrical signal from the carrier current.

An APD operating at the long-wavelength has already been introduced widely to 2.5 Gbit/s and 10 Gbit/s systems, and a device which is applicable to the next-generation system with the rate of 40 Gbit/s is in process of being developed. A hole-injection type APD having an InP avalanche multiplication layer has been commonly adopted as a relatively low-speed APD structure. Recently, an electron-injection type APD, which is superior in terms of operation speed, has been attracting attention.

A long-wavelength APD having an InGaAs optical absorption layer commonly employs an SAM (Separated Absorption and Multiplication) structure, in which an optical absorption layer and an avalanche multiplication layer (avalanche layer) are separated to suppress an increase of dark current induced by a narrow gap semiconductor. For control of the electric field intensity of the optical absorption layer and of the electric field intensity of the avalanche multiplication layer independently, an electric-field control layer and a bandgap graded layer are provided between the optical absorption layer and the avalanche multiplication layer.

FIG. 4 is a cross-sectional view showing a conventional mesa-type APD. The electron-injection type APD shown in FIG. 4 is configured to have an optical absorption layer 46 composed of a depleted InGaAs and an avalanche multiplication layer 43 composed of either InAlAs or InP. To be more specific, an electric-field control layer 44 and a bandgap graded layer 45 are provided between the avalanche multiplication layer 43 and the InGaAs optical absorption layer 46 which both are provided on an n-InP electrode layer 41. An InGaAs electrode layer 47 is formed on the optical absorption layer 46, and an electrode 49 is further formed thereon. An electrode 48 is also provided on the n-InP electrode layer 41. Unlike the hole-injection type APD, a guard ring structure which is formed by using a Zn diffusion technique cannot be adopted; therefore, a typical electron-injection type ADP is only allowed to have a mesa-type device structure as shown in FIG. 4. As a result, a fundamental problem arises in which dark current is increased around the junction periphery of the device.

In order to solve such a problem with dark current, various proposals have been made. For example, a structure in which an InP regrown layer covers the area around the mesa structure of a device has been proposed (refer to nonpatent document 1), and good characteristics have been reported. A structure in which electric field distribution is modulated around the operation region by ion implantation has also been reported (nonpatent document 2). Furthermore, a structure is also proposed in which a buffer layer including an n-type doped partial in-plane region is inserted between an avalanche multiplication layer and an n electrode layer so that the electric field intensity around the mesa becomes lower than that of the inside in operation (patent document 1).

However, even the proposed techniques described above have the following problems still remained to be solved. In the technique proposed in the nonpatent document 1, implanting a mesa structure of a semiconductor by regrowth is generally difficult, since growth behavior varies according to plane index. The technique also has a disadvantage in terms of production cost. The structure proposed in the nonpatent document 2, in which electric field distribution is modulated around the operation region by ion implantation, creates a trap level due to damage caused by implanted ion. Since impurities are non-activated by the trap level, there is a persisting concern about stability of the device. Regarding the structure proposed in the patent document 1, no practical guidance has been disclosed yet for designing the buffer layer including the n-type doped partial region.

As described above, although it is expected that the electron-injection type APD demonstrates superior features to those of the conventional hole-injection type APD, there were problems in terms of an increase of dark current and securing the device life time. A structure has also been proposed in which a mesa is buried in APD by use of semiconductor; however, the problems in difficulty of the production technique and production cost still remain to be solved. Having been made in consideration of the above-described problems, the present invention aims to provide a production technique of an electron-injection type APD without using of a diffusion technique. In addition, the provide APD has to be capable of providing a stable operation with low dark current. A technique regarding a "guard ring structure" is applied to the present invention for the purpose of achieving stable operation of the electron-injection type APD. Detailed explanations will be provided in the following section.

Patent document 1: Japanese Patent Application Laid-open No. 2005-086109

Patent document 2: Japanese Patent Application Laid-open No. 2005-223022

Nonpatent document 1: S. Tanaka, S. Fujisaki, Y. Matsuoka, T. Tsuchiya, S. Tsuji, "10 Gbit/s Avalanche Photodiodes Applicable to Non-Hermetic Receiver Modules," OFC2003, Vol. 1, MF55, p 67

Nonpatent document 2: Shono, Endo, Inomoto, Watanabe, Makita, Nakata, "10 Gbit/s high-sensitivity planar type APD for small optical receiver module" 2004 Proceedings of the Institute of Electronics, Information, and Communication Engineers General Conference C-4-37, p 365

DISCLOSURE OF THE INVENTION

In order to achieve the above-described goals, the invention described in claim 1 of Applicant's International Application No. PCT/JP2006/312800 provides an avalanche photodiode.

The avalanche photodiode is formed by sequentially laminating an n-type electrode layer, an avalanche multiplication layer, an electric field control layer, and a bandgap graded layer. On the bandgap graded layer, an optical absorption layer forming a mesa structure and a p-type electrode layer are sequentially formed. The avalanche photodiode is characterized by having a buffer layer and an n-type doping region. The buffer layer is formed between the n-type electrode layer and the avalanche multiplication layer. The n-type doping region having a substantially trapezoidal cross section area perpendicular to the laminated plane is formed on the inside of the interior portion of a region included in the interior portion of the buffer layer, having a contact with the n-type electrode layer, and having the mesa structure formed therein within the laminated plane. When the two nodes between the p-type electrode layer and the n-type electrode layer are reversely biased, the vicinity portion of the upper hem in the substantially trapezoidal cross section area in the n-type doping region is approximately depleted.

The invention described in claim 2 of Applicant's International Application No. PCT/JP2006/312800 is characterized in that the n-type doping region has concentration distributions monotonically increasing from the avalanche multiplication layer towards the n-type electrode layer and from the peripheral region towards the center within the n-type doping region.

The invention described in claim 3 of Applicant's International Application No. PCT/JP2006/312800 is characterized by having a first p-type optical absorption layer which is formed underneath a p-type electrode, and a low-concentration second optical absorption layer which is formed between the first optical absorption layer and the bandgap graded layer, and is depleted when the p-type electrode layer and the n-type electrode layer are reversely biased.

The invention described in claim 4 of Applicant's International Application No. PCT/JP2006/312800 is characterized in that the second optical absorption layer has a thickness set to be the maximum thickness fulfilling the condition in which in-plane distribution of avalanche multiplication coefficient in the device monotonically decreases from the center to the peripheral direction within the n-type doping region.

The invention described in claim 5 of Applicant's International Application No. PCT/JP2006/312800 is characterized in that each of the avalanche multiplication layer, the optical absorption layer, the first optical absorption layer, and the second optical absorption layer is composed of an InP/InGaAsP-based compound semiconductor or an InAlGaAs-based compound semiconductor.

According to the present invention, it is possible to relax the edge electric field in the peripheral part of the avalanche multiplication region without using a diffusion technique, and therefore possible to produce an electron-injection type APD with low dark current in a highly controlled manner.

BEST MODES FOR CARRYING OUT THE INVENTION

First Embodiment

Figure 1:
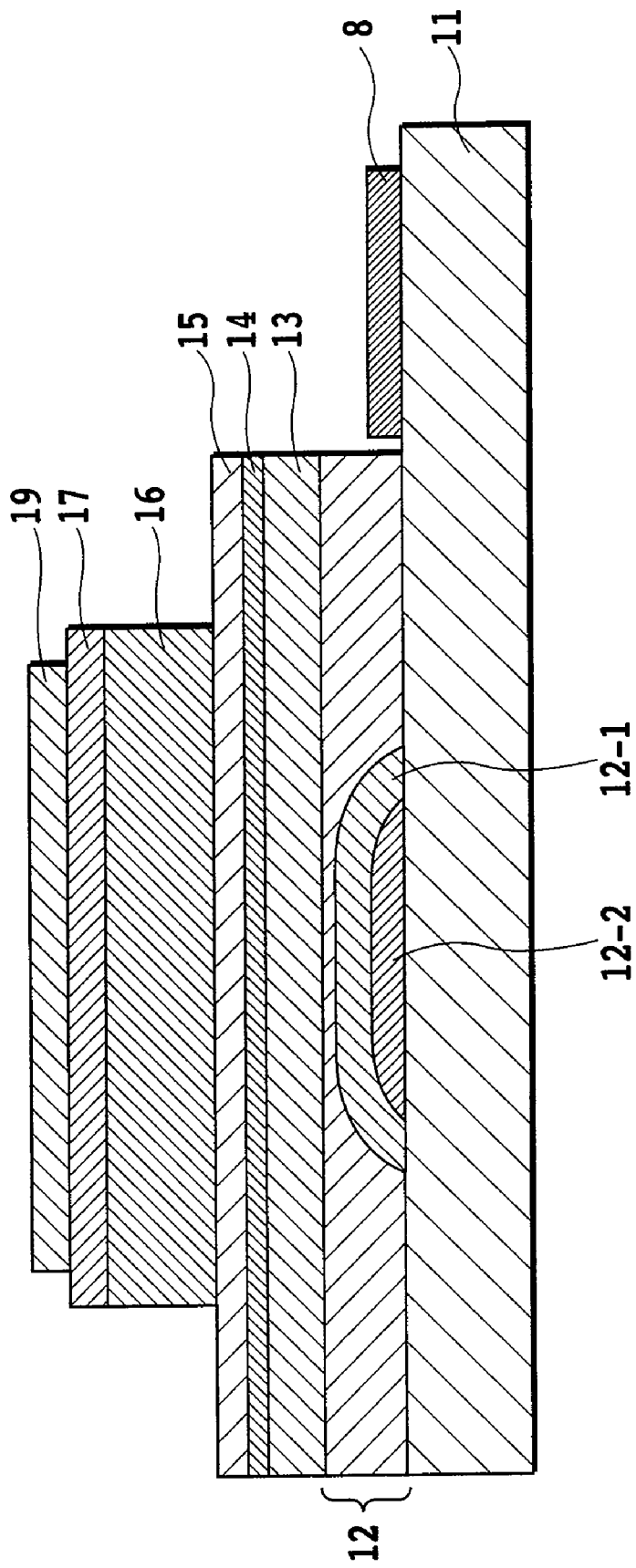
FIG. 1 is a cross-sectional view of the structure of an APD in accordance with a first embodiment of the present invention.

FIG. 1 is a structural drawing of an APD in accordance with a first embodiment of the present invention. On an n-type InP electrode layer 11, an InP buffer layer 12, an InP avalanche multiplication layer 13, an InP electric field control layer 14, and an InGaAsP bandgap graded layer 15 are formed in order. Furthermore, on the InGaAsP bandgap graded layer 15, a p-type InGaAs optical absorption layer 16 in a mesa structure, a p-type InGaAsP electrode layer 17, and a metal electrode 18 are provided. On the n-type InP electrode layer 11, a metal electrode 19 is also provided.

In addition, n-type InP doping regions 12-1 and 12-2 are formed locally within the InP buffer layer 12. The n-type InP doping region 12-2 is included within the n-type InP doping region 12-1. Furthermore, the n-type InP doping regions 12-1 and 12-2 have different doping concentrations. The structure and the fabrication method will be explained in detail in the later section. As will hereinafter be explained, with allocation of the n-type InP doping regions 12-1 and 12-2, an APD structure is obtained in which the surrounding region of the n-type InP doping regions 12-1 and 12-2 functions as a "guard ring."

In the present invention, it is an important point that the n-type InP doping region 12-1 is arranged so that the n-type InP doping region 12-1 is located inside of the periphery of the mesa structure of the InGaAs optical absorption layer 16. In the case of looking at the structure from the top of FIG. 1 (from top down in FIG. 1), which shows a cross-sectional structure of the device, in other words, in the case of looking at the structure from a direction perpendicular to the laminated planes of the layers of the device, the n-type InP doping region 12-1 is approximately a circular form or an oval figure. The type InP doping region 12-1 is arranged so that the periphery of the n-type InP doping region 12-1 is located within an area of the mesa-structure defined by the InGaAs optical absorption layer 16. In this structure, within the InP avalanche multiplication region 13 the electric field intensity in the part which has no n-type InP doping region 12-1 being located immediately below is decreased with a certain level of voltage applied; thus, depletion of the mesa lateral side of the InGaAs optical absorption layer 16 is prevented. As a result, electric field generation can be prevented. When electric field generation is prevented, it is possible to significantly reduce dark current originating from the lateral side surface of the mesa structure, and therefore to contribute to enhance the reliability of the device.

The APD of the present invention provided with the guard ring structure including the n-type InP doping region 12-1 can be produced, for example, in the following manner. Firstly, in order to form an InP buffer layer 12, an n-InP layer which corresponds to the n-type InP electrode layer 11 is grown on an InP substrate, and then undoped InP crystals are grown to form an undoped InP layer on the n-InP layer. After the formation of the buffer layer 12, the n-type InP doping regions 12-1 and 12-2 are formed by Si ion implantation. After implanted ion is activated in heat treatment, other layers, including layers from the InP avalanche multiplication layer to the p-type InGaAsP electrode layer 17, are also sequentially formed and grown thereon. The structures of the InGaAs optical absorption layer 16 and the avalanche multiplication layer 13 are defined by mesa process. Lastly, the metal electrodes 18 and 19, which are ohmic electrodes, are deposited, and heat treatment is applied.

When a reversely biased voltage is applied to the metal electrode 18 and the metal electrode 19, a high electric field is generated in the InP avalanche multiplication layer 13. The InP electric field control layer 14 carries out a function to adjust the difference of electric fields between the bandgap graded layer 15 and the part adjacent to the bandgap graded layer within the InGaAs optical absorption layer 16 to a predetermined value. A part of the InP avalanche multiplication layer 13, that is, the part above the n-type InP doping regions 12-1 and 12-2, has a depleted layer which is thinner than the surrounding part, and therefore becomes an avalanche multiplier active region (high electric field region).

The n-type doping region 12-1 can be seen as a substantially trapezoidal form with a round portion around the upper hem in the cross-sectional surface perpendicular to the laminated planes of the APD layers, as shown in FIG. 1. However, when a convex-trapezoidal n-type doping region 12-1 is introduced, local electric field concentration is prone to be generated in the part located on the side of InP avalanche multiplication layer 13.

Figure 5:
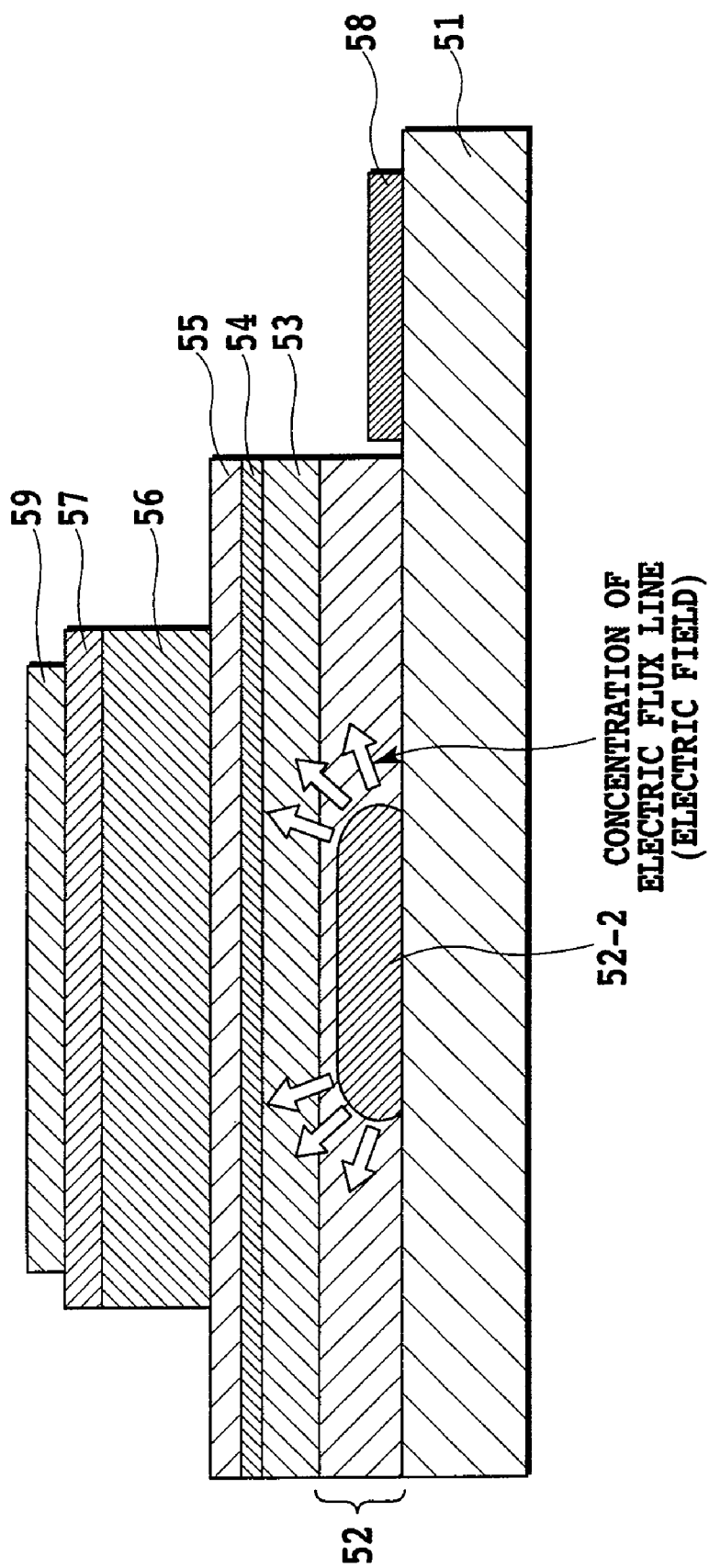
FIG. 5 shows electric field concentration in the buffer layer.

FIG. 5 shows electric field concentration when a buried n-type InP region is provided in the buffer layer. The basic structure of the APD shown in FIG. 5 is the same as that shown in FIG. 1. Difference between FIGS. 1 and 5 is that the structure shown in FIG. 5 is provided with the buried n-type InP region 52-1 in the buffer layer 52. In this case, local electric field concentration indicated by the arrows is generated in the surrounding part of the buried n-type InP region 52-1 in the side of the avalanche multiplication layer 53.

Even in the doping region structure of the present invention, it can be sometimes difficult to implement an intended APD operation due to such electric field concentration. Therefore, the present invention has the following characteristics. Specifically, the n-type InP doping region 12-1 has doping concentration distribution. In addition, in the surrounding part of the n-type doping region 12, the depleted region penetrates sufficiently deeply into the inside of the n-type InP doping region 12-1. A potential drop is generated in the part which the depleted region penetrates into. The potential drop can prevent an electric field increase in the upper side, that is, in the side of the InP avalanche multiplication layer 13, of the part in which the potential drop is generated; thus, it is possible to relax "electric field concentration at an edge part," which causes so-called local breakdown (edge breakdown). In FIG. 1, two n-type InP doping regions 12-1 and 12-2 are shown in order to indicate that there are different doping concentrations inside a doping region. It should, however, be noted that these 2 doping regions do not necessarily indicate that there were discontinuously differences in the characteristics of the two regions thus formed.

Hence, in order to prevent local breakdown (edge breakdown) more effectively, it is only necessary to set monotonically increasing doping profiles of the n-type InP doping region 12-1 each from the side of the avalanche multiplication layer 13 toward the n-type electrode layer 11, and from the peripheral region toward the center within the n-type InP doping region 12-1. Such a doping profile is so-called graded concentration distribution. Graded concentration distribution can be formed by utilizing spread of implanted ions in the depth direction and in the lateral direction. Thus, when the projection length of implanted ions is set to be in the vicinity of the interface between the n-type InP electrode layer 11 layer and the InP buffer layer 12 layer, electric field change in the lateral direction can be moderate. Hence, local concentration of electric fields is confined within the n-type doping region 12-1, and therefore local breakdown can be effectively prevented. Without employing a diffusion technique, the present invention can implement an intended APD operation by ion implantation which is relatively easy.

As described above, it is possible to relax an edge electric field in the surrounding area of the avalanche multiplication region by adopting the guard ring structure, which is characteristic of the present invention. Hence, an electron-injection type APD with low dark current can be produced in a highly controlled manner.

Second Embodiment

Figure 2:
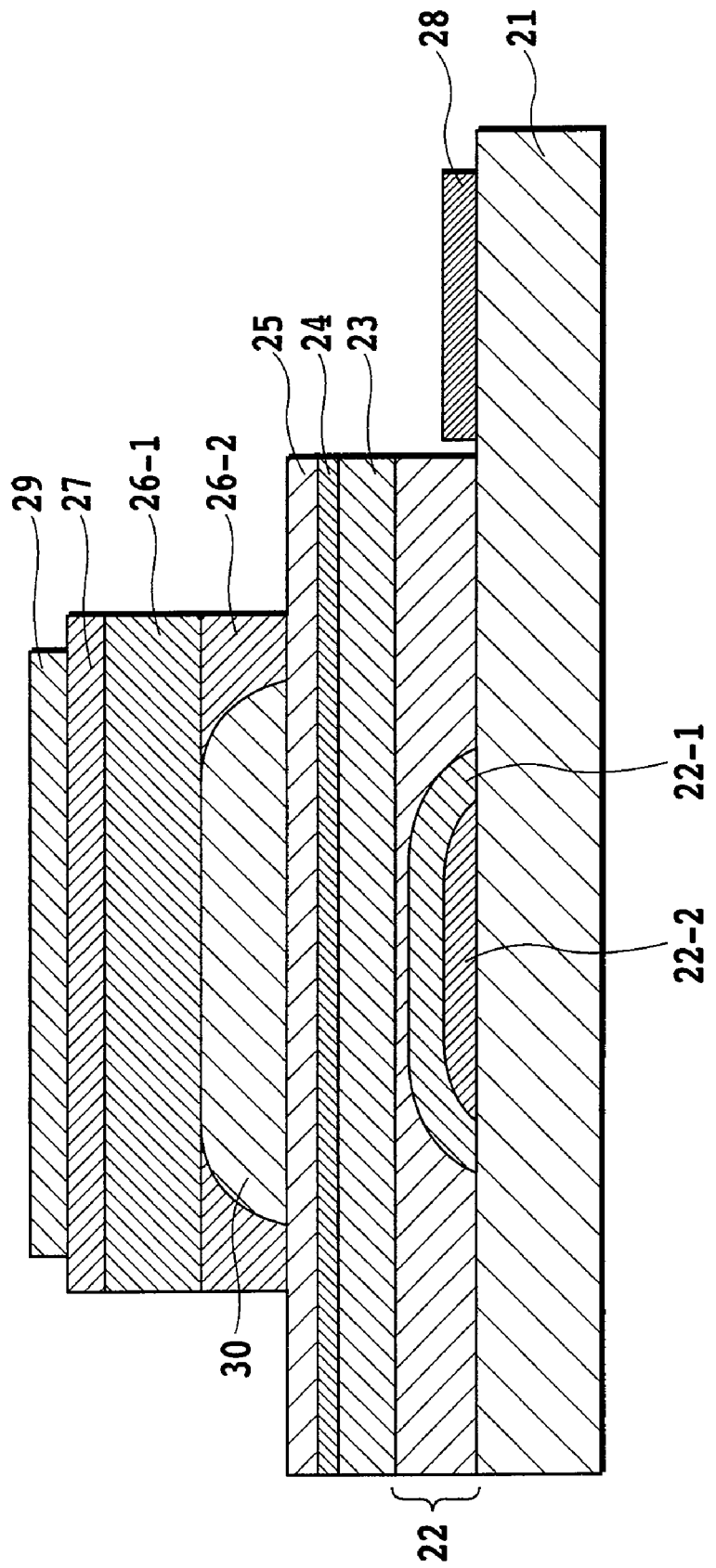
FIG. 2 is a cross-sectional view of the structure of an APD in accordance with a second embodiment of the present invention.

FIG. 2 is a structural drawing of an APD in accordance with a second embodiment of the present invention. On an n-type InP electrode layer 21, an InP buffer layer 22, an InP avalanche multiplication layer 23, an InP electric field control layer 24, and an InGaAsP bandgap graded layer 25 are sequentially formed. Furthermore, on the InGaAsP bandgap graded layer 25, an optical absorption layer and others which make up a mesa structure are formed. What is characteristic of the present invention is the provision of a second optical absorption layer.

To be more specific, on the InGaAsP bandgap graded layer 25, a low-concentration second InGaAs optical absorption layer 26-2, which is depleted in an operating state, is firstly formed. On the top of this, as described in the first embodiment, a first p-type InGaAs optical absorption layer 26-1, a p-type InGaAsP electrode layer 27, and a metal electrode 29 are provided. On the top of the n-type InP electrode layer 21, a metal electrode 29 is also provided.

As described in the first embodiment, in a part of the InP buffer layer 22, n-type InP doping regions 22-1 and 22-2 are formed. The n-type InP doping region 22-2 is included in the n-type InP doping region 22-1, and the n-type InP doping regions 22-1 and 22-2 have different doping concentrations. The periphery of the n-type InP doping region 22-1 is arranged to be located inside of the periphery of the mesa structure of the first p-type InGaAs optical absorption layer 26-1. Such an arrangement is also the same as described in the first embodiment. An APD having this structure can be produced according to the same method as described in the first embodiment. The n-type InP doping regions 22-1 and 22-2 are formed inside the periphery of the mesa structure region in the view from the direction perpendicular to the lamination planes of the APD; thus, a depleted region 30 is generated within the second InGaAs optical absorption layer 26-2.

In general, simply thickening the InP buffer layer 22 to a reasonable degree is also effective in preventing depletion of the lateral side of the optical absorption layer, and in preventing electric field generation in an avalanche multiplication layer. Although such thickening is not as effective as introduction of the guard ring structure described in the first embodiment, it is certainly effective in preventing depletion.

The second embodiment is, together with the guard ring structure of the first embodiment, characterized by including two optical absorption layers. In other words, the second embodiment is characterized by further including a low-concentration second InGaAs optical absorption layer 26-2 being added between the first p-type InGaAs optical absorption layer 26-1 and the InP avalanche multiplication layer 23 in the conventional structure. Since the thickness of the whole optical absorption layer in this structure is increased, responsivity of the optical absorption layer can be improved without lowering the operation band width. This is also described in detail in Japanese Patent Application Laid-open No. 2005-223022 (patent document 2) by the inventors of the present application.

Even if the guard ring structure shown in the first embodiment, namely "electric field concentration relaxation structure," is introduced, it is not always possible to avoid edge breakdown for the low-concentration second InGaAs optical absorption layer 26-2 with a given thickness. In the present invention, thickness of the second InGaAs optical absorption layer 26-2 is set as large as possible within the range in which no breakdown occurs. Next, a method for determining thickness of the second InGaAs optical absorption layer will be explained.

Figure 3:
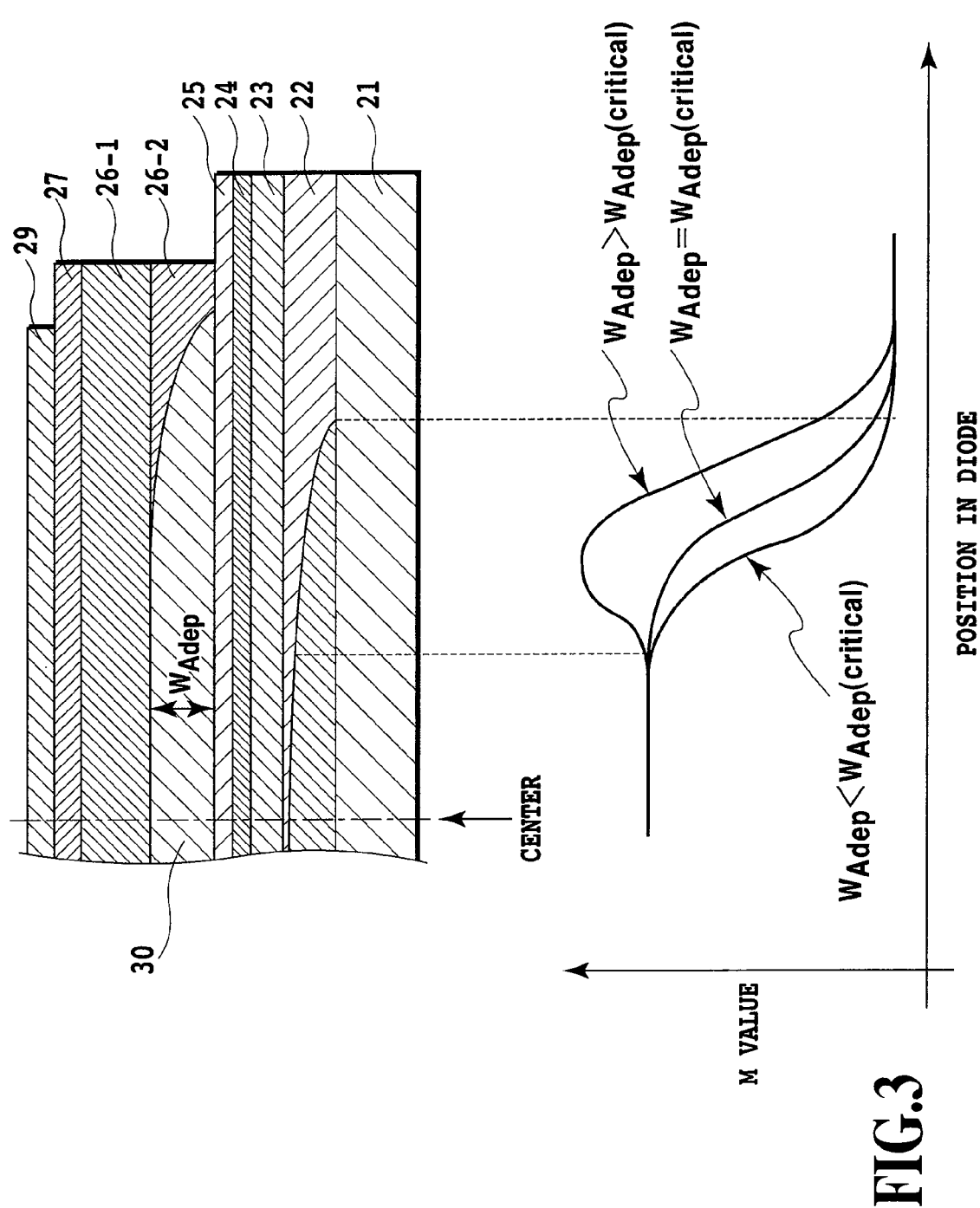
FIG. 3 shows a positional change of M with the thickness of a low-doping optical absorption layer as a parameter.
Figure 4:
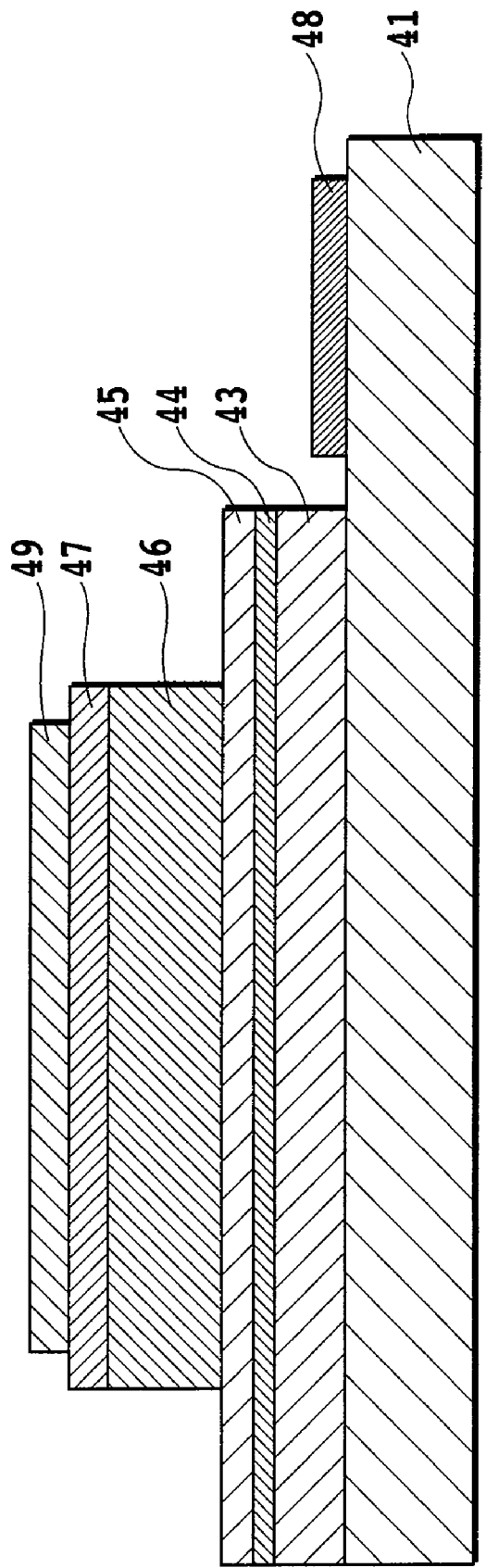
FIG. 4 is a cross-sectional view of the structure of a conventional mesa-type APD.

FIG. 3 is a schematic drawing showing how an avalanche multiplication coefficient M changes in the device when thickness of the low-doping concentration second InGaAs optical absorption layer 26-2 is changed. When $W_{Adep}$ is thicker than a threshold value $W_{Adep(critical)}$, the avalanche multiplication coefficient M value, from the center point of the mesa structure of the device towards the peripheral region thereof, once increases and then decreases. That means edge breakdown occurs. Under such a condition, even if the electric field of the InP avalanche multiplication layer 23 is decreased, and an ionization rate is accordingly decreased, the effect by spread of thickness of the effective avalanche multiplication layer becomes more dominant. Thus, the avalanche multiplication coefficient M value increases as a result.

Hence, it is possible to avoid edge breakdown by setting the thickness of the low-concentration second InGaAs optical absorption layer 26-2 to the maximum thickness which allows the avalanche multiplication coefficient M to decrease monotonically from the center point of the mesa structure to the peripheral part thereof.

For an APD structure including a typical InP avalanche multiplication layer with the thickness of $W_{AV}$=2500 A, $W_{Adep(critical)}$ is calculated to be approximately 4000 A when the concentration of the n-type InP doping region 22 is set to be $2\times10^{17}/cm^3$. It is certain that $W_{Adep(critical)}$ changes according to $W_{AV}$. As thicker the $W_{AV}$, larger $W_{Adep(critical)}$ becomes.

As described in detail above, although the electron-injection type APD has been expected to demonstrate superior performance in principle, compared to the hole-injection type ADP including a conventional InP avalanche multiplication layer, a high production technology is required to obtain a stable and highly-reliable device. There is also a problem to be solved in terms of cost. According to the present invention which utilizes a relatively easy production technology, such as ion implantation, upon introducing a "guard ring structure," it is possible to produce an electron-injection type APD in which no edge breakdown occurs and light-receiving efficiency can be maximized. Requiring no diffusion technique, the present invention not only has an advantage in terms of production cost, but also enables to provide an APD device applicable to the next generation 40 Gb/s system.

INDUSTRIAL APPLICABILITY

According to the present invention, in which the edge electric field in the peripheral part of the avalanche multiplication region can be relaxed without adopting of a diffusion technique, it is possible to produce an electron-injection type APD with low dark current in a highly controlled manner.

The invention claimed is:

1. An avalanche photodiode formed by sequentially depositing an n-type electrode layer, an avalanche multiplication layer, an electric field control layer, a bandgap graded layer, an optical absorption layer and a p-type electrode layer, the optical absorption layer and the p-type electrode layer forming a mesa structure, the avalanche photodiode comprising:
   a buffer layer formed between the n-type electrode layer and the avalanche multiplication layer; and
   an n-type doping region being formed inside of said buffer layer and within an area defined by said mesa structure, as viewed from the mesa structure, being brought into contact with the n-type electrode layer, having a substantially trapezoidal shape in cross section,
   wherein the n-type doping region has a monotonically increasing concentration distribution both from the avalanche multiplication layer toward the n-type electrode layer and from the peripheral region towards the center within the n-type doping region.

2. The avalanche photodiode according to claim 1, wherein said optical absorption layer includes:
   a first p-type optical absorption layer being formed underneath the p-type electrode layer; and
   a low-concentrated second optical absorption layer being formed between the first optical absorption layer and the bandgap graded layer, and being depleted when the p-type electrode layer and the n-type electrode layer are reversely biased.

3. The avalanche photodiode according to claim 2, wherein the second optical absorption layer has a thickness that is set to be the maximum thickness fulfilling the condition in which the in-plane distribution of avalanche multiplication coefficient in the device monotonically decreases from the center to the peripheral direction within the n-type doping region.

4. The avalanche photodiode according to claim 2, wherein each of the avalanche multiplication layer, the optical absorption layer, the first optical absorption layer, and the second optical absorption layer is composed of any one of an InP/InGaAsP-based compound semiconductor and an InAlGaAs-based compound semiconductor.

* * * * *